(12) United States Patent
Gambino et al.

(10) Patent No.: US 9,245,850 B2
(45) Date of Patent: Jan. 26, 2016

(54) THROUGH SILICON VIA WAFER, CONTACTS AND DESIGN STRUCTURES

(71) Applicant: INTERNATIONAL BUSINESS MACHINES CORPORATION, Armonk, NY (US)

(72) Inventors: Jeffrey P. Gambino, Westford, VT (US); Cameron E. Luce, Essex Junction, VT (US); Daniel S. Vanslette, Fairfax, VT (US); Bucknell C. Webb, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/301,395

(22) Filed: Jun. 11, 2014

(65) Prior Publication Data

US 2014/0284816 A1    Sep. 25, 2014

Related U.S. Application Data

(62) Division of application No. 13/626,025, filed on Sep. 25, 2012, now Pat. No. 8,791,016.

(51) Int. Cl.
*H01L 23/48* (2006.01)
*H01L 23/522* (2006.01)
(Continued)

(52) U.S. Cl.
CPC ........ *H01L 23/5384* (2013.01); *G06F 17/5045* (2013.01); *G06F 17/5077* (2013.01); *H01L 21/76843* (2013.01); *H01L 21/76844* (2013.01); *H01L 21/76898* (2013.01);
(Continued)

(58) Field of Classification Search
CPC .................................................. H01L 21/76898
USPC ........................................................... 438/667
See application file for complete search history.

(56) References Cited

U.S. PATENT DOCUMENTS 5,219,789 A    6/1993    Adan
6,270,601 B1   8/2001    Ritland et al.
(Continued)

FOREIGN PATENT DOCUMENTS

CN    1213844    4/1999

OTHER PUBLICATIONS

Stamper et al. "CMOS Compatible Insulated Through Silicon Vias for 3D Silicon", Advanced Metallization Conference, 2009, IBM Microelectronics, 8 pages.
(Continued)

*Primary Examiner* — Victor A Mandala
*Assistant Examiner* — Regan J Rundio
(74) *Attorney, Agent, or Firm* — Anthony Canale; Andrew M. Calderon; Roberts Mlotkowski Safran & Cole, P.C.

(57) ABSTRACT

Disclosed herein are through silicon vias (TSVs) and contacts formed on a semiconductor material, methods of manufacturing, and design structures. The method includes forming a contact hole in a dielectric material formed on a substrate. The method further includes forming a via in the substrate and through the dielectric material. The method further includes lining the contact hole and the dielectric material with a metal liner using a deposition technique that will avoid formation of the liner in the via formed in the substrate. The method further includes filling the contact hole and the via with a metal such that the metal is formed on the liner in the contact hole and directly on the substrate in the via.

19 Claims, 5 Drawing Sheets

(51) Int. Cl.
*H01L 21/768* (2006.01)
*H01L 23/538* (2006.01)
*G06F 17/50* (2006.01)
*H01L 23/00* (2006.01)
*H01L 27/02* (2006.01)

(52) U.S. Cl.
CPC ........... *H01L 23/481* (2013.01); *H01L 23/562* (2013.01); *H01L 27/0207* (2013.01); *H01L 2224/48091* (2013.01); *H01L 2224/73257* (2013.01); *H01L 2924/1305* (2013.01)

(56) References Cited

U.S. PATENT DOCUMENTS

| | | | |
|---|---|---|---|
| 6,365,513 B1 * | 4/2002 | Furukawa et al. | 438/667 |
| 6,388,208 B1 * | 5/2002 | Kiani et al. | 174/266 |
| 6,887,785 B1 * | 5/2005 | Dobuzinsky et al. | 438/638 |
| 6,976,238 B1 | 12/2005 | Teig et al. | |
| 7,060,624 B2 | 6/2006 | Andricacos et al. | |
| 7,521,360 B2 | 4/2009 | Halahan et al. | |
| 7,741,226 B2 | 6/2010 | Andry et al. | |
| 7,830,018 B2 | 11/2010 | Lee | |
| 8,080,881 B2 | 12/2011 | Tsao et al. | |
| 8,097,955 B2 | 1/2012 | Zimmermann et al. | |
| 2009/0177445 A1 * | 7/2009 | Capps et al. | 703/1 |
| 2009/0280643 A1 | 11/2009 | Andry et al. | |
| 2010/0009531 A1 | 1/2010 | Choi et al. | |
| 2010/0032809 A1 * | 2/2010 | Collins et al. | 257/621 |
| 2010/0187670 A1 | 7/2010 | Lin et al. | |
| 2011/0244676 A1 * | 10/2011 | Chen et al. | 438/643 |
| 2011/0284992 A1 | 11/2011 | Zhu | |
| 2012/0068356 A1 | 3/2012 | Ahles et al. | |
| 2012/0074584 A1 | 3/2012 | Lee et al. | |

OTHER PUBLICATIONS

Stamper et al. "Through Wafer Via Integration in CMOS and BiCMOS Technologies", Advanced Metallization Conference, 2008, IBM Microelectronics, 6 pages.

Malladi et al. "3D Integration Techniques Applied to SiGe Power Amplifiers", IBM Semiconductor Research and Development Center, Essex Junction, http://www.ecsdl.org/terms-use.jsp, The Electrochemical Society, pp. 1053-1067, 2008.

Dudek et al. "Thermo-Mechanical Reliability Assessment for 3D Through-Si Stacking", 2009 IEEE, 10th Int. Conf. on Thermal, Mechanical and Multiphysics Simulation and Experiments in Micro-Electronics and Micro-Systems, EuroSimE 2009, 7 pages.

* cited by examiner

THROUGH SILICON VIA WAFER, CONTACTS AND DESIGN STRUCTURES

FIELD OF THE INVENTION

The invention relates to semiconductor structures and, more particularly, to through silicon vias (TSVs) and contacts formed on a semiconductor material, methods of manufacturing, and design structures.

BACKGROUND

Through silicon vias (TSV) are used for a number of applications, including low inductance ground connections for RF devices. Typically, TSVs are filled with either tungsten or copper, which are electrically insulated from the substrate. In such processes, the substrate is insulated from the tungsten using a TiN liner, in order to avoid degradation of the silicon within the TSV. Degradation, of the silicon, is known to lead to cracking and reduced fracture strength of the substrate.

Tungsten filled TSVs have a number of advantages compared to copper filled TSVs. For example, tungsten can be deposited by chemical vapor deposition (CVD), so it is easy to fill high aspect ratio vias. However, a disadvantage of tungsten compared to copper is that the elastic modulus is high. The high elastic modulus, in turn, results in a higher stress in the silicon for tungsten filled TSV verses copper filled TSV. Hence there is a higher risk of wafer cracking and die cracking for tungsten filled TSV than copper filled TSV.

Figure 1:
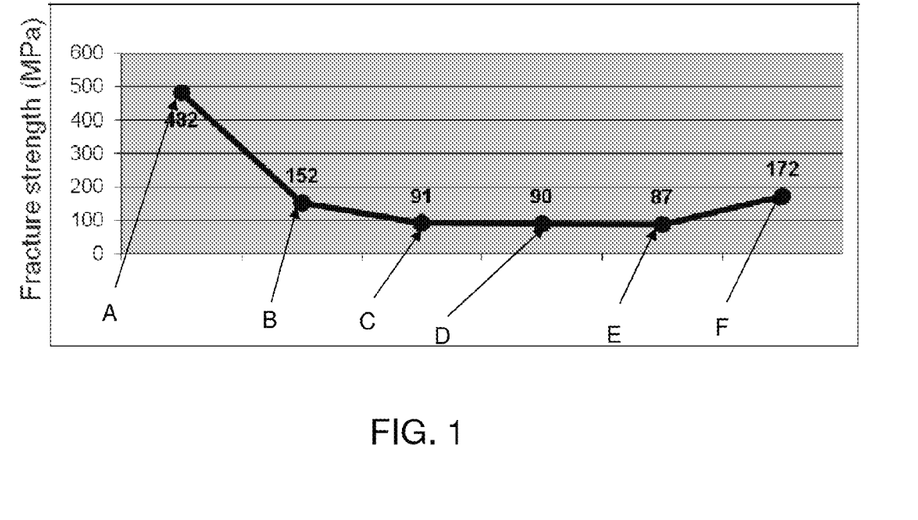
FIG. 1 shows a graph of wafer fracture strength in a conventional through silicon via.

FIG. 1, for example, shows the fracture strength of wafers in different configurations. More specifically, FIG. 1 shows the fracture strength of a silicon wafer without a TSV, and during additional processes. For example, the fracture strength shown at point "A" is representative of a silicon wafer without a TSV. On the other hand, point "B" is representative of the fracture strength of the wafer with a TSV etched into the substrate. As shown, point "B" exhibits an approximate 50% reduction in strength compared to a silicon wafer without a TSV. Points "C", "D" and "E" represent the fracture strength of the wafer post fill with tungsten. Here, again, the fracture strength at points "C", "D" and "E" is lower than even point "B". The wafer again regains some strength after it is thinned, as shown at point "F". Although the wafer regains some fracture strength, it never exhibits the same strength as shown at point "A", and barely greater than that at point "B". Accordingly, it is shown in this graph that fracture strength is greatly reduced by having a TSV, and even further reduced by using conventional tungsten fill processes.

Accordingly, there exists a need in the art to overcome the deficiencies and limitations described hereinabove.

SUMMARY

In an aspect of the invention, a method comprises forming a contact hole in a dielectric material formed on a substrate. The method further comprises forming a via in the substrate and through the dielectric material. The method further comprises lining the contact hole and the dielectric material with a metal liner using a deposition technique that will avoid formation of the liner in the via formed in the substrate. The method further comprises filling the contact hole and the via with a metal such that the metal is formed on the liner in the contact hole and directly on the substrate in the via.

In another aspect of the invention, a method comprises forming a contact hole in a dielectric material formed on a substrate. The method further comprises forming a via in the substrate and through the dielectric material, wherein the via is formed in a star shaped pattern. The method further comprises lining at least the contact hole with a metal liner. The method further comprises filling the contact hole and the via with a metal such that the metal is formed on the liner in the contact hole.

In an aspect of the invention, a structure comprises a through silicon via provided in a substrate, which includes metal deposited directly on the substrate. The structure further comprises a contact provided in a dielectric layer on top of the substrate and which includes a metal liner and the metal formed directly on the metal liner.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the through silicon via wafer and/or contacts of the present invention. In still further embodiments, a method in a computer-aided design system is provided for generating a functional design model of the through silicon via wafer. The method comprises generating a functional representation of the through silicon via wafer of the present invention.

Specifically, in another aspect of the invention, a hardware description language (HDL) design structure is tangibly stored in a computer readable storage medium. The HDL design structure comprises elements that when processed in a computer-aided design system generates a machine-executable representation of a semiconductor device which is implemented for designing, manufacturing, or testing the semiconductor device. The HDL design structure comprises: a through silicon via provided in a substrate, which includes metal deposited directly on the substrate; and a contact provided in a dielectric layer on top of the substrate and which includes a metal liner and the metal formed directly on the metal liner.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to through silicon vias (TSVs) and contacts formed on semiconductor materials, methods of manufacturing, and design structures. In more specific embodiments, the contacts are formed using a selective liner deposition process with, e.g., a refractory metal. In embodiments, the TSV will be devoid or substantially devoid of such liner material, due to the selective liner deposition process implemented by the present invention. In embodiments, the selective liner deposition process is, for example, a metal sputtering technique. In alternate embodiments, the TSV can be formed in a star configuration with a liner or devoid of any liner material. Advantageously, in either TSV implementation, the TSV will exhibit increased fracture strength.

In more specific embodiments, the present invention improves fracture strength of silicon with tungsten filled TSVs. A selective liner technique can be used to form a liner in a contact hole. For example, a sputtered Ti/W liner or other refractory metal can be deposited to a substantial thickness (>10 nm) in contact holes (e.g., which are used to form contacts), providing low contact resistance. However, the thickness of the Ti/W liner or other refractory metal is nominal, e.g., <<10 nm, for the TSV, due to the dimensions of the via used to form the TSV.

In embodiments, the ratio of liner of the contact to the TSV is 10:1 or greater. This is due to, for example, the dimensions, e.g., depth and width, of both the contact hole and the via (of the TSV), in combination with the selective liner deposition process. In embodiments, a tungsten or other fill metal can be deposited directly on silicon in the via, forming the TSV. The adhesion of tungsten (or other metal fill material described herein) to silicon is much higher than that of CVD TiN (or other liner material) to silicon. Hence, the structures formed in accordance with the fabrication processes of the present invention will exhibit increased critical stress for crack nucleation (at the metal-silicon interface in the TSV), resulting in higher fracture strength. In alternative embodiments, the TSV can be patterned in a star layout which reduces stress in silicon (or other semiconductor material) adjacent to the tungsten of other metal fill, resulting in lower driving force for crack growth.

Figure 2:
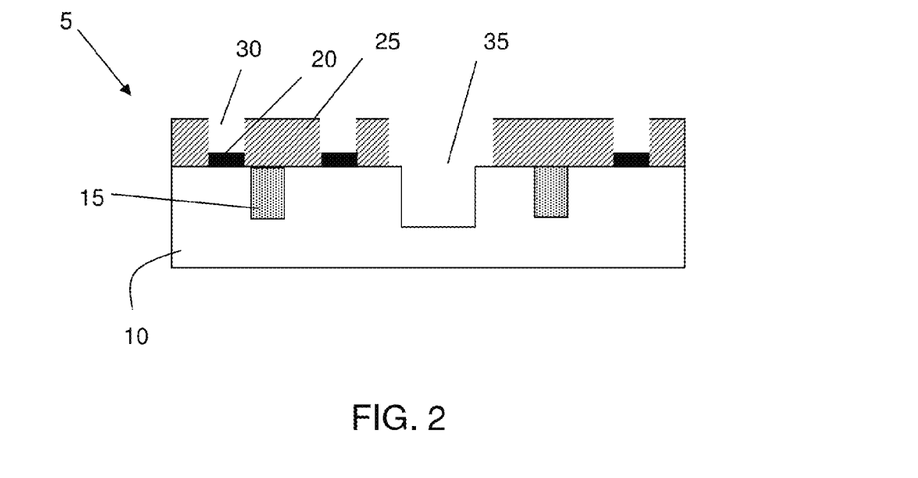
FIGS. 2-5 show processing steps and respective structures in accordance with aspects of the present invention.

FIG. 2 shows processing steps and a respective intermediate structure in accordance with aspects of the present invention. In particular, the structure 5 includes a substrate 10. In embodiments, the substrate 10 can be any semiconductor substrate such as, for example, silicon (Si), SiGe, Gallium Arsenide (GaAs), etc. In embodiments, shallow trench isolation (STI) structures 15 are formed in the substrate 10, between active or passive devices 20. In embodiments, the STI structures 15 can be formed from oxide, using conventional lithography, etching and deposition processes. For example, a resist can be formed on the substrate 10, and exposed to light to form a pattern (openings). A reactive ion etching (RIE) can then be performed to form trenches in the substrate 10. The trenches can then be filled with insulator material, e.g., oxide, using conventional deposition processes, e.g., chemical vapor deposition (CVD). Any excess oxide formed on the surface of the substrate 10 can be removed using, for example, a chemical mechanical polish (CMP). The devices 20 can then be formed on the substrate 10 using conventional device formation processes, well known to those of ordinary skill in the art such that no further explanation is required herein. The devices 20 can be, for example, field effect transistors (FETs), bipolar transistors, etc., all formed using conventional processes.

Still referring to FIG. 2, a dielectric material 25 can be formed over the substrate 10, including the STI structures 15 and the devices 20. The dielectric material 25 can be any contact dielectric material such as, for example, oxide or other insulator materials. The dielectric material 25 can be formed using conventional deposition processes, e.g., CVD. In embodiments, the dielectric material 25 can be planarized using conventional processes, e.g., CMP. Contact holes 30 can be formed in the dielectric material 25, to expose one or more of the devices 20. In embodiments, the contact holes 30 are formed using conventional lithography and etching (RIE) processes. In embodiments, the contact holes 30 can be about 0.2 microns to about 1 micron in diameter, and about 0.5 micron to about 1 micron in depth.

By masking the devices 20, a via (e.g., through via) 35 can be formed in the substrate 10 using lithography and etching (RIE) processes. In embodiments, the etching process for formation of the via 35 can be a Bosch process (also known as pulsed or time-multiplexed etching). In embodiments, the dielectric material 25 and the substrate 10 can be separately etched to form the via 35, using a two step masking process. In further embodiments, the via 35 can be formed by an alternating and repeated standard, nearly isotropic plasma etch using, e.g., $SF_6$, followed by deposition of a chemically inert passivation layer, e.g., $C_4F_8$ (Octafluorocyclobutane). In embodiments, the via 35 can be formed to a depth of about 50 microns or greater, and a width of 10 microns or less, as one example. For example, the via can be about 150 microns in depth. After formation of the via 35, the mask can then be removed using, e.g., conventional oxygen ashing techniques.

Figure 3:
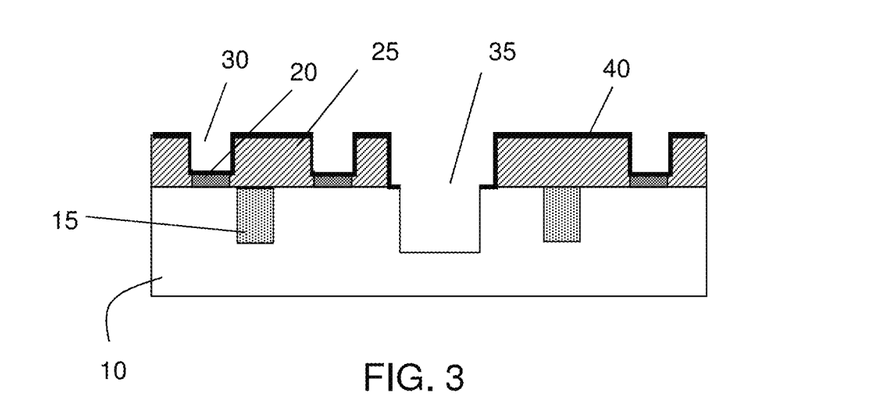

In FIG. 3, a liner 40 is formed over exposed surfaces of the dielectric material 25 and exposed devices 20. For example, the liner 40 can be formed in the contact holes 30, over the devices 20 and on a surface of the dielectric material 25. In embodiments, the liner 40 is formed by sputter deposition techniques. In this way, the liner 40 will not be formed within the via 35 (at least below a few microns deep). In embodiments, the liner 40 is a refractory metal. In more specific embodiments, the liner is titanium, titanium tungsten (TiW) or alloys thereof, or TiN, to name a few materials. The liner 40 can have a thickness of about 10 nm to about 50 nm; although, other thicknesses are also contemplated by the present invention.

In embodiments, the selective liner deposition process, e.g., sputtering process, will be timed to form a liner of about 10 nm within the contact holes 30. Advantageously, due to depth and width of the via 35, the liner 40 will not form on the substrate 10 within the via 35. In embodiments, the ratio of liner material within the contact hole 30 to the via 35 is 10:1 or greater. This is due to, for example, the dimensions, e.g., depth and width, of both the contact hole 30 and the via 35, in combination with the selective deposition process of the liner.

Figure 4:
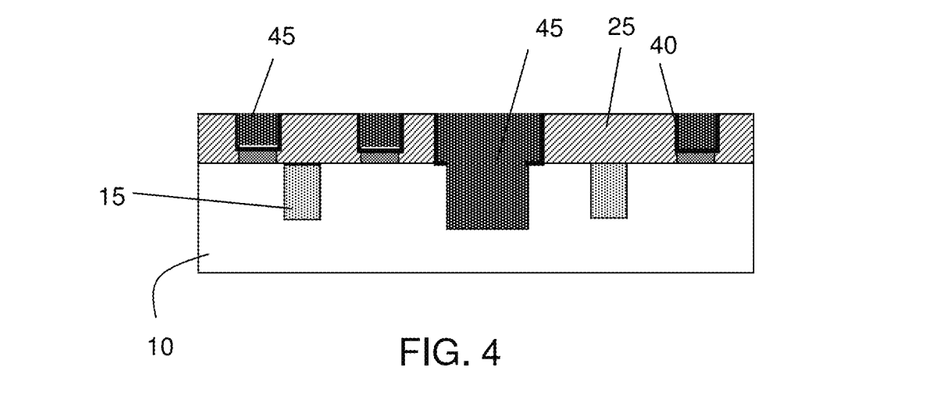

In FIG. 4, the contact holes 30 and via 35 are simultaneously filled with material 45 in accordance with aspects of the present invention. In specific embodiments, the contact holes 30 and via 35 are filled with tungsten using a CVD process. After deposition of the tungsten, the liner 40 can be removed from a top surface of the dielectric material 25 with any residual material (material 45), using conventional CMP processes. In embodiments, and advantageously, the fill material 45, e.g., tungsten, can be deposited directly on silicon or other semiconductor material within the via 35, to form the TSV. In this way, the adhesion of tungsten (or other metal fill material) to the silicon or other semiconductor material is greatly improved compared to conventionally lined TSV structures. The improved adhesion properties, in turn, increases the critical stress for crack nucleation (at the metal-silicon interface in the TSV), resulting in higher fracture strength.

Figure 5:
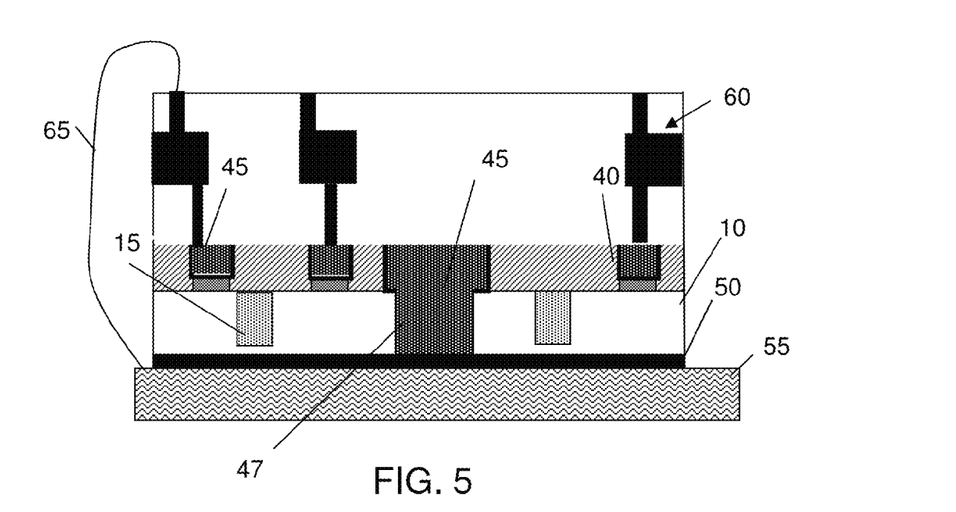

FIG. 5 shows additional processing steps and a respective structure, in accordance with aspects of the present invention. As shown in FIG. 5, the backside of the substrate (wafer) 10 undergoes a grinding or other removal process to expose the material 45 within the via 35 (now formed as a TSV 47). A metallization 50 is formed on the backside of the substrate 10, in contact with the TSV 47. The die is attached to a substrate 55 using a conductive adhesive, that forms an electrical connection to the metallization 50. Moreover, using conventional processes, additional structures, devices, and/or metallization layers can be formed over dielectric layer 25, generally shown at reference numeral 60. A wire 65 can be connected between the substrate 55 and a device/structure 60.

Figure 6A:
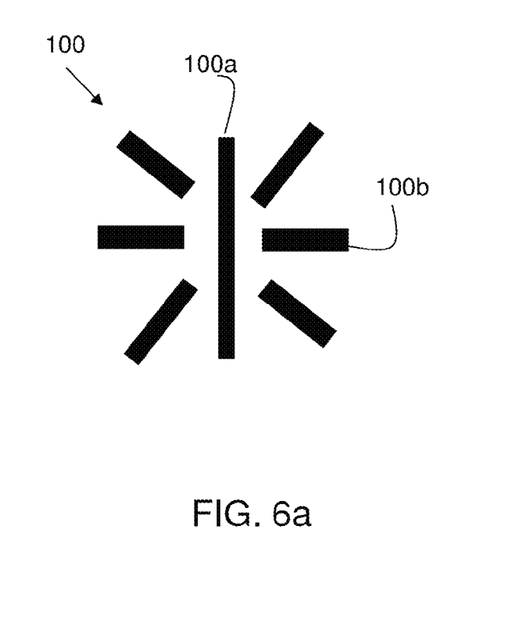
FIGS. 6a and 6b show alternative patterns for through silicon vias (TSV) and respective fabrication processes, in accordance with aspects of the present invention.
Figure 6B:
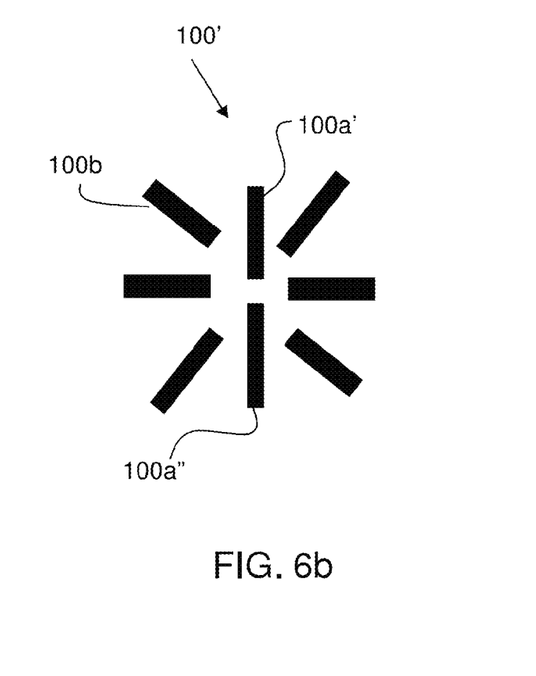

FIGS. 6*a* and 6*b* show alternative TSV structures fabricated in accordance with aspects of the present invention. In both FIGS. 6*a* and 6*b*, the TSV structures comprise a star configuration. It should be understood by those of skill in the art that the star configuration shown in FIGS. 6*a* and 6*b* are illustrative examples of such configuration, and that this should not be considered a limiting feature of the present invention. For example, the TSV structures can include more or less legs than shown in FIGS. 6*a* and 6*b* without departing from the scope of the present invention. The embodiments shown in FIGS. 6*a* and 6*b* can be used in combination with the embodiments shown, for example, in FIGS. 1-5.

In embodiments, the TSV structures shown in FIGS. 6*a* and 6*b* can be fabricated using conventional lithography, etching and deposition techniques. The TSV structures of both FIGS. 6*a* and 6*b* can be lined with any appropriate liner material described herein, or can be devoid of a liner. In embodiments, the liner can be formed by a conventional CVD process. In further embodiments, the TSV structures shown in FIGS. 6*a* and 6*b* can be filled with any appropriate metal or metal alloy. For example, the TSV structures can be formed from any appropriately used refractory metal, e.g., tungsten, or copper, etc.

In FIG. 6*a*, the TSV structure 100 comprises a single leg 100*a* with six legs 100*b* surrounding the leg 100*a*, to form a star configuration. In embodiments, a minimum spacing between each of the legs 100*a*, 100*b* can be about 5 microns; although the present invention contemplates a spacing from about 2 microns to about 10 microns. In embodiments, a spacing larger than 10 microns is also contemplated, but with the understanding that such spacing will require additional chip space. In further embodiments, the spacing can also be a function of the fill material, as understood by one of ordinary skill in the art.

In further embodiments, the width of each of the legs 100*a*, 100*b* can range from about 1 micron to about 10 microns, with a preference of about 3 microns. It should be understood that each leg of the same length should preferably have the same width due to etch stop considerations, e.g., to ensure that the legs are all of the same or substantially the same depth. Accordingly, in the example shown in FIG. 6*a*, the leg 100*a* may be slightly smaller in width than the remaining legs 100*b* due to its larger length, to ensure that the etch depth remains the same for each leg 100*a*, 100*b*. By way of example, the single leg 100*a* (longer leg) may have a width of 2.8 microns; whereas, the other, shorter, legs 100*b* may have a width of about 3 microns. In this way, all of the legs 100*a*, 100*b* would have the same etch depth.

FIG. 6*b* shows a variation of the TSV structure of FIG. 6*a*. More specifically, in the TSV structure 100' of FIG. 6*b*, the single leg is broken into two legs 100*a'* and 100*a"*. The TSV structure 100' also includes the six legs 100*b* surrounding the legs 100*a'* and 100*a"*, to form the star configuration. In embodiments, the two legs 100*a'* and 100*a"* can be substantially of the same length and width as the legs 100*b*. Accordingly, in this configuration, the etch depth will also be the same or substantially the same. As in FIG. 6*a*, the minimum spacing between each of the legs 100*a'*, 100*a"* and 100*b* can be about 5 microns; although a spacing of about 2 microns to about 10 microns (and greater) is also contemplated by the present invention. Moreover, the width of each of the legs 100*a'*, 100*a"* and 100*b* can range from about 1 micron to about 10 microns, with a preference of about 3 microns. By way of example, the legs 100*a'*, 100*a"* and 100*b* may each have a width of about 3 microns.

Figure 7:
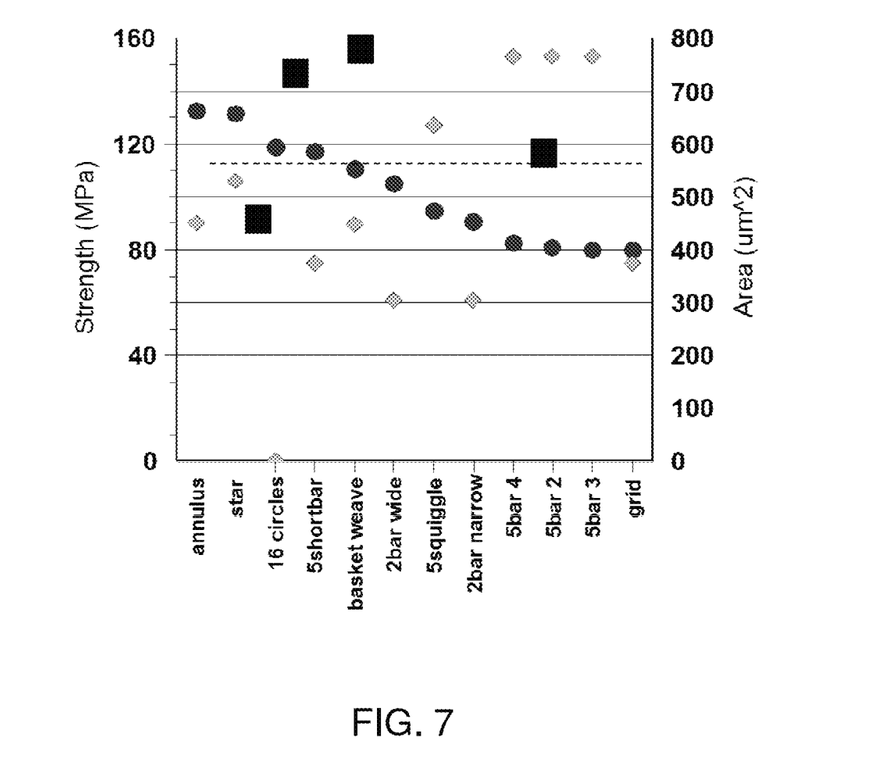
FIG. 7 shows a graph comparing fracture strength of structures fabricated in accordance with the present invention and other structures.

FIG. 7 shows a graph comparing fracture strength of a TSV star configuration and other patterned structures. In FIG. 7, the left-side y-axis is representative of strength (MPa), the right-side y-axis is representative of area ($\mu^2$) and the x-axis is representative of different TSV patterns. As shown in FIG. 7, the different patterns include: annulus, star, 16 circles, 5 shortbar, basket weave, 2 bar wide, 5 squiggle, 2 bar narrow, 5 bar 4, 5 bar 2, 5 bar 3 and a grid pattern, as would be known by those of skill in the art. As shown in the representative graph, the diamonds are representative of metal fill area, the circles are representative of a TiN lined TSV and the squares are representative of a TiW lined TSV. As can be seen from the results shown in FIG. 7, the star configuration of the present invention provides a significantly improved fracture strength for both a TiN liner and TiW liner, while also providing less metal area. The relatively high metal area importantly results in a relatively low resistance and inductance. Accordingly, it is possible to maximize fracture strength while providing the highest metal area that is possible (i.e., for low inductance and low resistance). The star design has the highest metal area for designs that result in high fracture strength.

Figure 8:
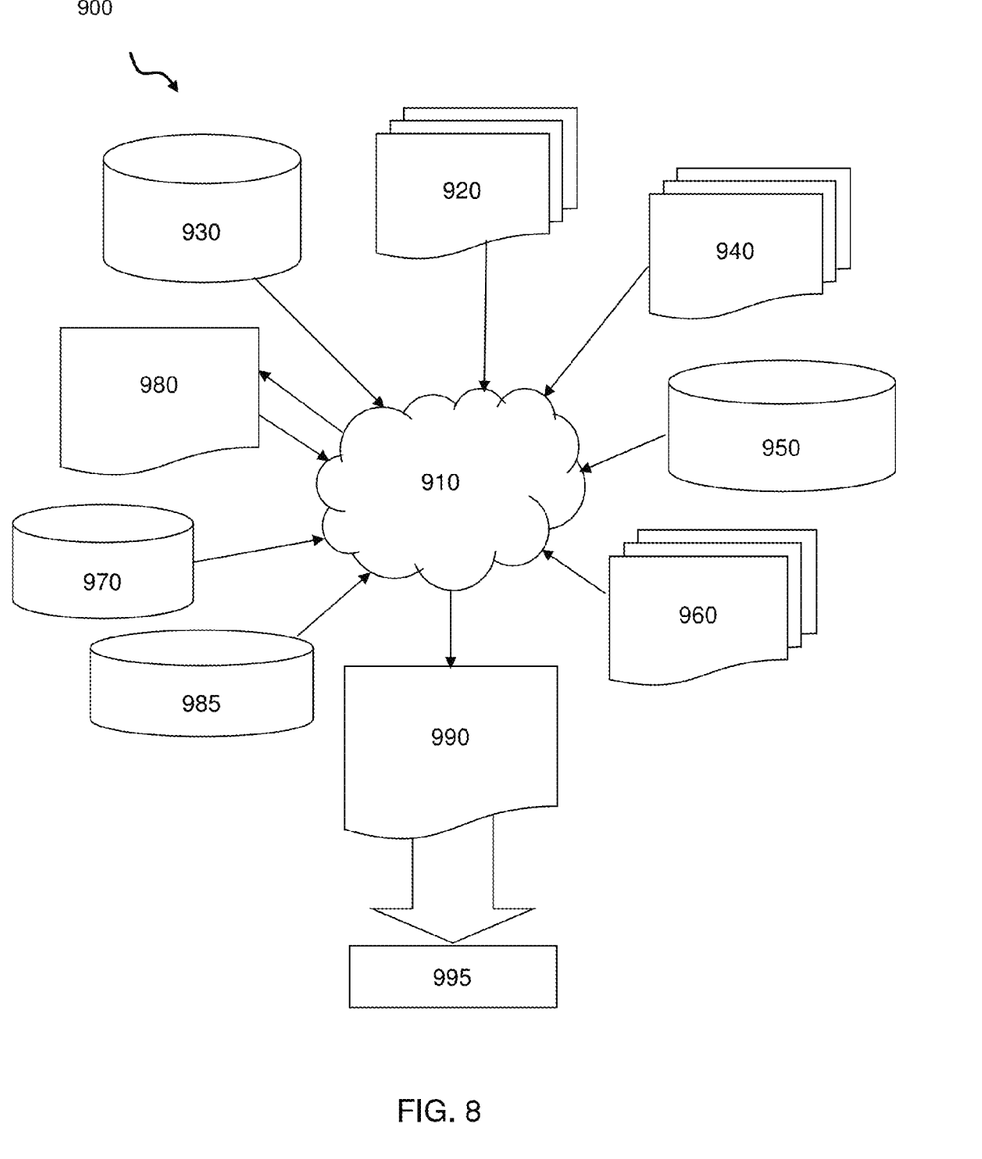
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-5, 6*a* and 6*b*. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-5, 6a and 6b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-5, 6a and 6b and to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-5, 6a and 6b. In one embodiment, design structure 990 may comprise a compiled, executable HDL simulation model that functionally simulates the devices shown in FIGS. 2-5, 6a and 6b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-5, 6a and 6b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a through silicon via provided in a substrate, the through silicon via including a first metal deposited directly on the substrate;
a contact provided in a dielectric layer on top of the substrate, the contact including a metal liner and the first metal formed directly on the metal liner; and
wherein the metal liner is further provided between and directly contacting both the dielectric layer, and an upper portion of the through silicon via.

2. The structure of claim 1, wherein the through silicon via comprises a via that is deeper and wider than a contact hole forming the contact.

3. The structure of claim 1, wherein the through silicon via is substantially devoid of the metal liner.

4. The structure of claim 3, wherein:
the through silicon via comprises a bottom surface and vertical surfaces; and
the bottom surface is devoid of the metal liner.

5. The structure of claim 4, wherein the vertical surfaces are devoid of the metal liner.

6. The structure of claim 3, further comprising one or more devices covered by the metal liner.

7. The structure of claim 1, wherein the metal liner is a single layer.

8. The structure of claim 1, wherein:
the substrate is composed of a semiconductor material comprising silicon;
the dielectric layer is composed of a dielectric material on and over the substrate;
the upper portion of the through silicon via extends through the dielectric layer, and a lower portion of the through silicon via extends through the substrate; and
a lower portion of the through silicon via directly contacts the semiconductor material of the substrate.

9. The structure of claim 8, wherein a vertical sidewall of the metal of the lower portion of the through silicon via directly contacts a vertical sidewall of the semiconductor material of the substrate.

10. A structure comprising:
a through silicon via provided in a substrate, the through silicon via including a first metal deposited directly on the substrate; and
a contact provided in a dielectric layer on top of the substrate, the contact including a metal liner and the first metal formed directly on the metal liner,
wherein the through silicon via is a star shaped pattern, comprising a plurality of disjunct and segmented legs spaced from one another, and around a single center leg.

11. A structure comprising:
a through silicon via provided in a substrate, the through silicon via including a first metal deposited directly on the substrate; and
a contact provided in a dielectric layer on top of the substrate, the contact including a metal liner and the first metal formed directly on the metal liner,
wherein the through silicon via is a star shaped pattern, comprising a plurality of disjunct and segmented legs spaced from one another and around a center leg vertically split into two legs.

12. A hardware description language (HDL) design structure stored in a computer readable hardware storage device, the HDL design structure comprising elements that, when processed in a computer-aided design system, generate a machine-executable representation of a semiconductor device which is implemented for designing, manufacturing, or testing the semiconductor device, wherein the HDL design structure comprises:
a through silicon via provided in a substrate, which includes a first metal deposited directly on the substrate; and
a contact provided in a dielectric layer on top of the substrate and which includes a metal liner and the first metal formed directly on the metal liner,
wherein the through silicon via is a star shaped pattern, comprising a plurality of legs spaced from one another, and around at least one center leg.

13. The HDL design structure of claim 12, wherein the through silicon via comprises a via that is deeper and wider than a contact hole forming the contact.

14. The HDL design structure of claim 12, wherein the plurality of legs are disjunct, and the through silicon via is a star shaped pattern, comprising two center legs.

15. The HDL design structure of claim 12, wherein the through silicon via is substantially devoid of the metal liner.

16. The HDL design structure of claim 12, wherein:
the through silicon via comprises a bottom surface and vertical surfaces; and
the bottom surface is devoid of the metal liner.

17. The HDL design structure of claim 16, wherein the vertical surfaces are devoid of the metal liner.

18. The HDL design structure of claim 12, further comprising one or more devices covered by the metal liner.

19. The HDL design structure of claim 12, wherein the metal liner is a single layer.

* * * * *